(12) United States Patent
Li et al.

(10) Patent No.: US 9,923,454 B2
(45) Date of Patent: Mar. 20, 2018

(54) FAST HIGH-SIDE POWER FET GATE SENSE CIRCUIT FOR HIGH VOLTAGE APPLICATIONS

(71) Applicant: Texas Instruments Incorporated, Dallas, TX (US)

(72) Inventors: Zheng Li, San Jose, CA (US); Wai Cheong Chan, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 148 days.

(21) Appl. No.: 14/989,387

(22) Filed: Jan. 6, 2016

(65) Prior Publication Data

US 2016/0134184 A1    May 12, 2016

Related U.S. Application Data

(62) Division of application No. 13/964,342, filed on Aug. 12, 2013, now Pat. No. 9,263,952.

(51) Int. Cl.
*G01R 19/00* (2006.01)
*H02M 1/38* (2007.01)
*H02M 3/158* (2006.01)

(52) U.S. Cl.
CPC .......... *H02M 1/38* (2013.01); *G01R 19/0084* (2013.01); *G01R 19/0092* (2013.01); *H02M 3/1588* (2013.01); *Y02B 70/1466* (2013.01)

(58) Field of Classification Search
USPC ............. 324/713, 762.09; 323/282, 349–353
See application file for complete search history.

(56) References Cited

U.S. PATENT DOCUMENTS 5,258,662 A * 11/1993 Skovmand ............ H02M 3/073
                                                                    323/349
7,479,770 B2   1/2009 Kohout et al.
9,263,952 B2   2/2016 Li et al.

FOREIGN PATENT DOCUMENTS

CN    102594193 A    7/2012
CN    103025012 A    4/2013
JP    2006301869 A   11/2006

OTHER PUBLICATIONS

Office Action for Chinese Application No. 201410393707.3, dated Oct. 9, 2017 (6 pages).

* cited by examiner

*Primary Examiner* — Vincent Q Nguyen
(74) *Attorney, Agent, or Firm* — William B. Kempler; Charles A. Brill; Frank D. Cimino

(57) ABSTRACT

A circuit for sensing gate voltage of a power FET. A switching circuit includes a switching FET having a high voltage rating, its drain coupled to the gate of the power FET, and its source coupled to an output node. A first feedback loop is coupled to the gate of the switching FET to facilitate sensing rising gate voltage. A second feedback loop is coupled to the gate of the switching FET to facilitate sensing falling gate voltage.

10 Claims, 5 Drawing Sheets

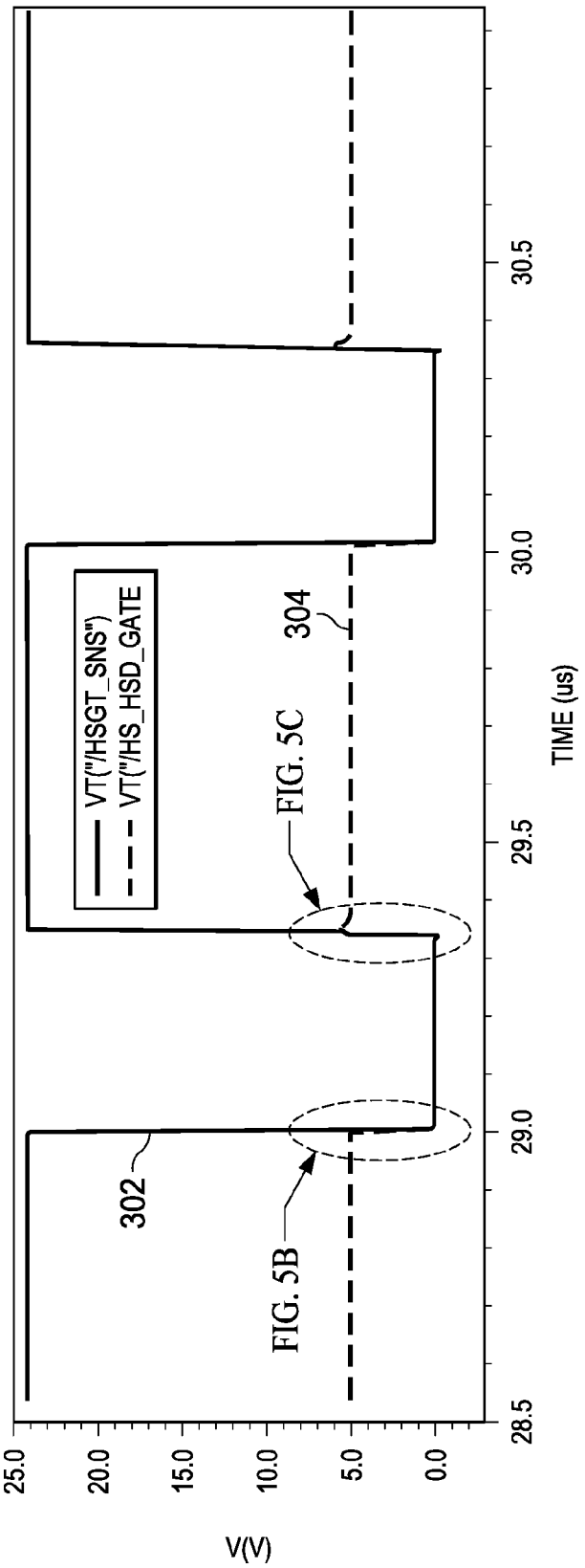

US 9,923,454 B2

FAST HIGH-SIDE POWER FET GATE SENSE CIRCUIT FOR HIGH VOLTAGE APPLICATIONS

CROSS-REFERENCE TO RELATED APPLICATIONS

This patent application is a divisional of U.S. Nonprovisional patent application Ser. No. 13/964,342, filed Aug. 12, 2013, which is incorporated herein by reference in its entirety for all purposes.

TECHNICAL FIELD

The present disclosure relates generally to sensing circuits, and more particularly, to a circuit for sensing the gate voltage of a power FET.

BACKGROUND

A buck regulator is a step-down DC-to-DC converter and is useful in many circuit applications, particularly high-power circuits. A power field effect transistor ("FET" or "MOSFET") is designed to handle higher power levels than other semiconductor devices, and is therefore often used as a switch in a buck regulator.

For example, a synchronous buck regulator has a high-side power FET for charging an inductor and a low-side power FET for re-circulating the stored inductor current. Typically, the high-side power FET is sensed for control of the buck regulator. To avoid shoot-through, the low-side FET cannot turn on until high-side FET turns off. Thus, a circuit is required to sense when the high-side FET is off. Accurate and fast sensing is critical to achieve the best circuit performance. The sense circuit needs to be fast to minimize dead time when both FETs are off, and it needs to be accurate to prevent the low-side FET from turning on too early and causing shoot-through.

Prior solutions usually sense the gate-source voltage $V_{GS}$ of the high-side FET. However, this generates a sense signal in the high-voltage domain, and therefore requires level-shifting circuitry to bring the signal down to the low-voltage domain in order to be processed by other circuitry. This approach is accurate but slow due to the delay introduced by the level shift circuit. To compensate for this delay, the low-side FET can be made to turn on a little bit earlier. However, accuracy will be compromised because delay from the level shift varies with different operating conditions and process variations. Thus, under certain conditions, the low-side FET could turn on too early and cause shoot-through.

Therefore, it remains desirable to find an improved solution for generating a sense signal that is fast and accurate for controlling buck regulators and other useful power circuits.

BRIEF DESCRIPTION OF THE DRAWINGS

FIG. 5A is a graph plotting both the voltage output from the gate sense circuit and the gate voltage versus time.

DETAILED DESCRIPTION

1. Buck Regulator

Figure 1:
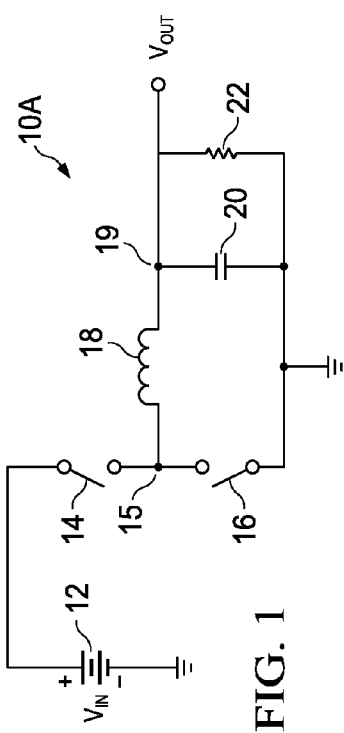
FIG. 1 is a circuit schematic for one embodiment of a conventional buck regulator.

FIG. 1 illustrates a conventional buck regulator circuit 10A. A voltage source 12 is coupled between ground and a first switch 14 to selectively provide an input voltage $V_{IN}$ to the circuit 10. A second switch 16 is coupled between the first switch 14 at node 15 and ground. An inductor 18 is coupled between node 15 and node 19 that presents the output voltage $V_{OUT}$ on node 19. A capacitor 20 is coupled between node 19 and ground, and a load is shown as resistive element 22 and is also coupled between node 19 and ground.

When the first switch 14 closes, current flows through the inductor 18 and into the load 22 thus charging the inductor by increasing its magnetic field thereby increasing $V_{OUT}$. When $V_{OUT}$ reaches a specified value, the first switch 14 is opened and the second switch 16 is closed by a control circuit (not shown). Current continues to flow through the inductor 18 as the magnetic field collapses and the inductor discharges. Before the inductor 18 completely discharges, the second switch 16 is opened, the first switch 14 is closed, and the cycle is repeated. The magnitude of $V_{OUT}$ is proportional to the period of time during which the first switch 14 is on.

Figure 2:
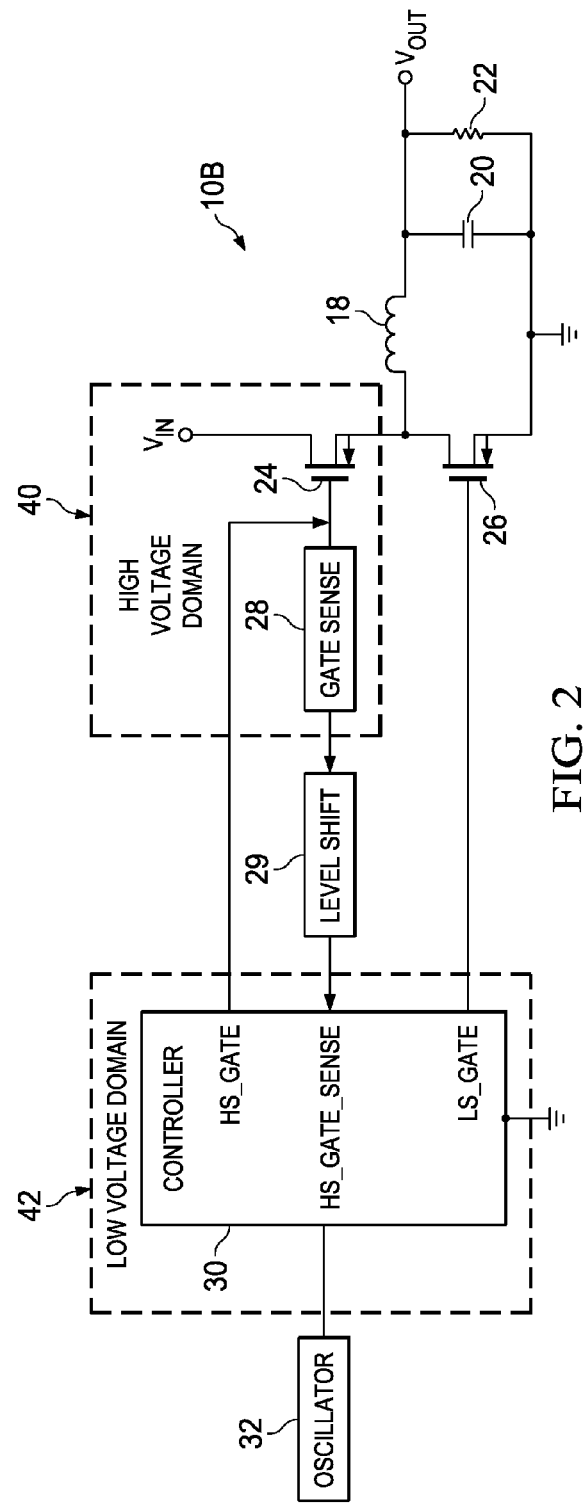
FIG. 2 is a circuit schematic for another embodiment of a conventional buck regulator.

FIG. 2 illustrates an alternative embodiment of a conventional synchronous buck regulator circuit 10B having the same basic configuration as circuit 10A in FIG. 1, except that the switches are implemented using enhancement mode NMOS power FET's 24 and 26, respectively. The use of power MOSFET switches enables fast synchronous switching at a rate on the order of several hundred kHz to MHz, with very low resistive losses on the order of 10 mΩ or less. An implementation of an asynchronous Buck regulator uses a Schottky diode in place of the low-side switch 26.

In addition, a control circuit 30 is coupled to switches 24 and 26, and an oscillator 32 is coupled to the control circuit. However, because high-side switch 24 is a high-voltage switch, a circuit 28 is coupled to the gate to obtain a gate signal in the high voltage domain, and another circuit 29 is coupled to the circuit 28 to provide level shifting of the sensed gate signal from the high voltage domain 40 to the low voltage domain 42 in order to be processed by the control circuit 30 in the low voltage domain. In one embodiment, the control circuit 30 may be a pulse width controller that uses either voltage and/or current feedback in a control loop to regulate the output voltage $V_{OUT}$ in response to changes in the load 22.

Typically, control circuit 30 senses the gate-source voltage $V_{GS}$ of at least the high-side MOSFET 24, and generates a sense signal in the high-voltage domain, which must then be level-shifted down to the low-voltage domain in order to be processed by the controller.

2. Gate Sense Circuit

Figure 3:
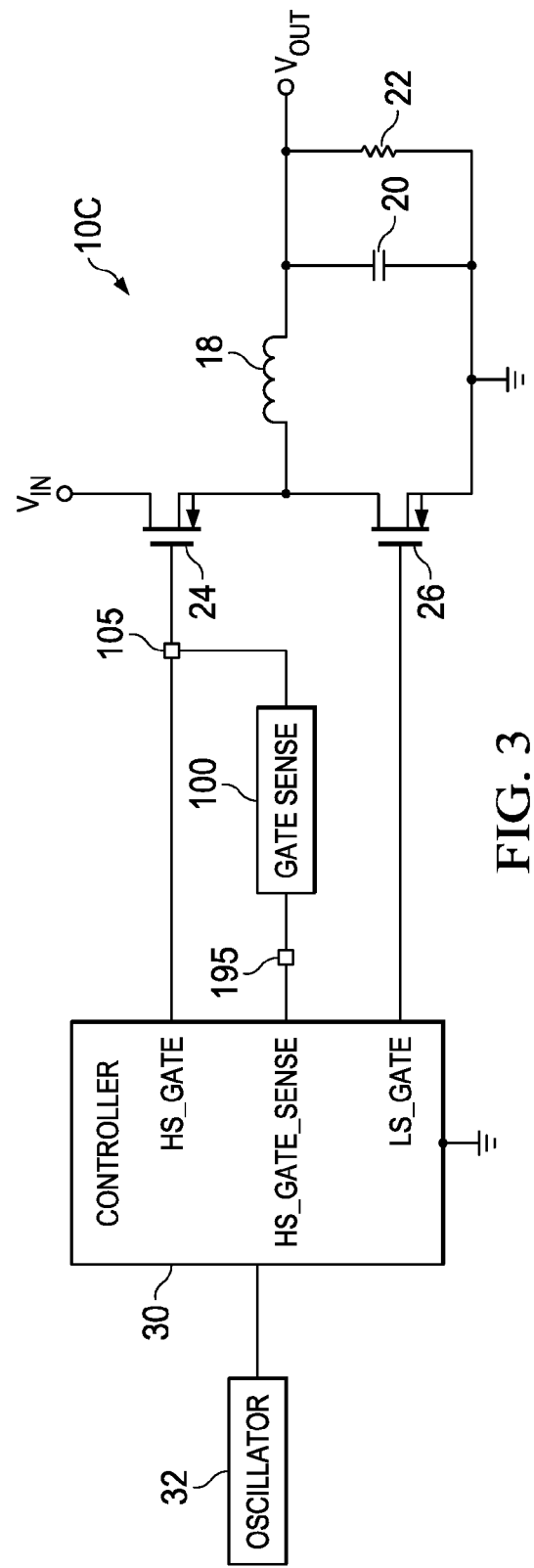
FIG. 3 is a circuit schematic for an embodiment of an improved buck regulator having a gate sense circuit.

FIG. 3 illustrates a circuit embodiment 10C that is a variation of the circuit embodiment 10B of FIG. 2, wherein a gate sense circuit 100 is coupled between the gate of the high-side MOSFET switch 24, e.g., at node 105, and a high-side gate sense input HS_GATE_SENSE of controller 30, e.g., at node 195. In one embodiment, the gate sense circuit 100 is integrated with the controller 30. The gate sense circuit 100 is a switching circuit used to couple the gate sense signal directly to the high-side gate without the need for level shifting, which usually generates propagation delay on the order of 10 ns or more. Thus, the only switching delay comes from the resistance of high-voltage switch 120 (shown in FIG. 4) and the parasitic capacitance at node 195. In one practical embodiment, resistance is on the order of hundreds of ohms, and parasitic capacitance is on the order of tens of femtofarads, which results in a time constant of less than 1 ns. The transition gets even faster when the positive feedback loop 110 (see FIG. 4) kicks in.

Figure 4:
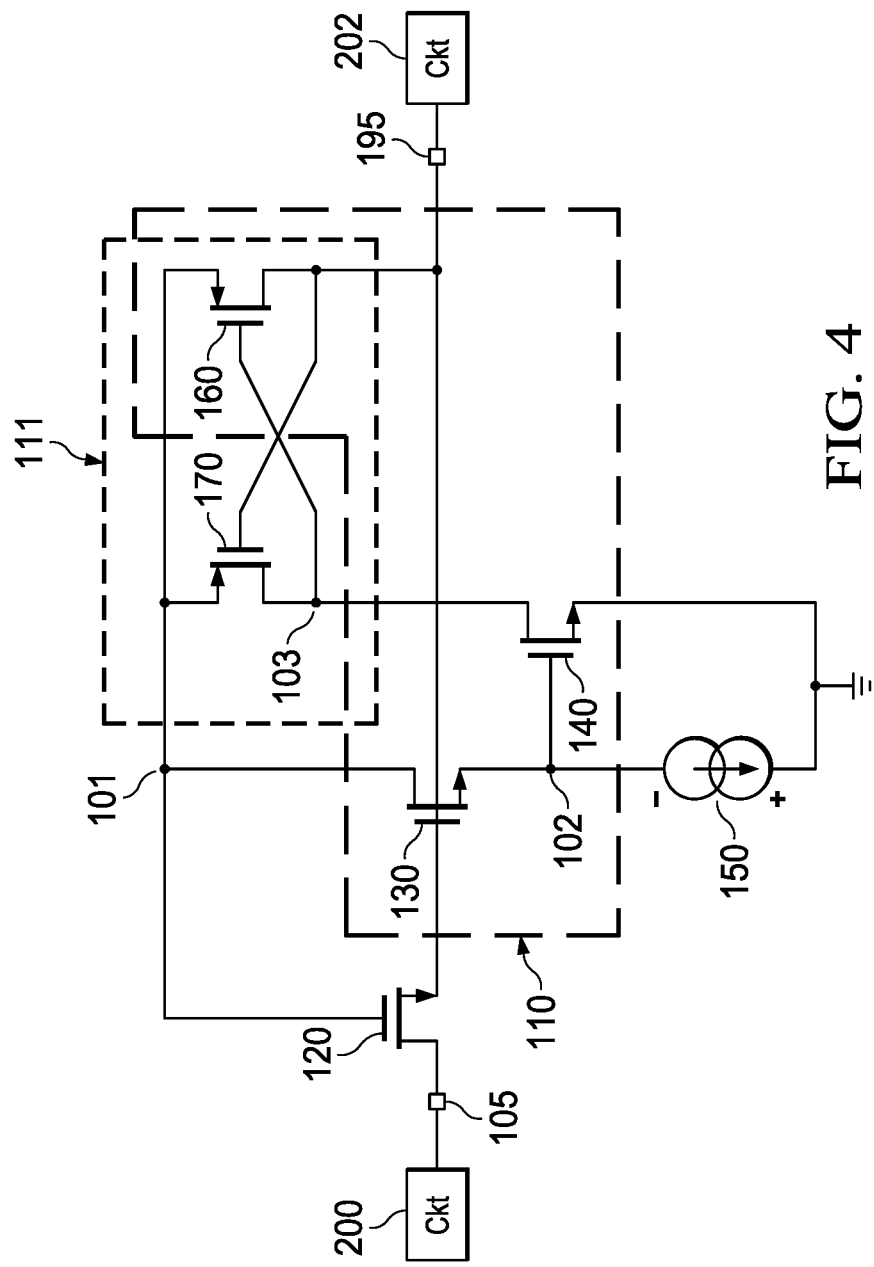
FIG. 4 is a detailed circuit schematic for the gate sense circuit of FIG. 3.

FIG. 4 illustrates one embodiment of the gate sense circuit 100. The gate sense circuit 100 includes an input node 105 connected to the gate of the high-side power FET of an application circuit 200, such as a buck regulator, and an output node 195 that provides the GATE_SENSE signal to a useful circuit 202, such as a controller for a buck regulator.

In this embodiment, the gate sense circuit 100 includes a first switch 120, a second switch 130, a third switch 140, a current source 150, a fourth switch 160, and a fifth switch 170. Each of the switches is a MOSFET switch as described more fully below. However, the first switch 120 is a MOSFET switch rated for high-voltage which may see voltage as high as the gate voltage of the high-side MOSFET switch 24 at node 105. The second switch 130, third switch 140, fourth switch 160 and fifth switch 170 are MOSFET switches rated for lower voltage and are dependent on the low voltage supply $V_{DD}$ at node 101.

The first switch 120 has its drain coupled to the input node 105, its source coupled to the gate of the second switch 130, the gate of the fifth switch 170 and the drain of the fourth switch 160, e.g., at node 195, and its gate coupled to the drain of the second switch, the source of the fourth switch 160 and the source of the fifth switch 170, e.g. at node 101.

The second switch 130 has its drain coupled to the gate of the first switch 120, e.g. at node 101, and its gate coupled to the source of the first switch, the gate of the fifth switch 170 and the drain of the fourth switch 160, e.g., at node 195. In addition, the source of the second switch 130 is coupled to the gate of the third switch 140 and to current source 150, e.g. at node 102.

The third switch 140 has its gate coupled to the source of the second switch 130 and to current source 150, e.g. at node 102. In addition, the drain of the third switch 140 is coupled to the drain of the fifth switch 170 and the gate of the fourth switch 160, e.g., at node 103, and the source of the third switch is coupled to ground.

The fourth switch 160 has its source coupled to the gate of the first switch 120, the drain of the second switch 130, and the source of the fifth switch 170, e.g., at node 101. The drain of the fourth switch 160 is coupled to the gate of the fifth switch 170, the gate of the second switch 130 (and hence the source of the first switch 120), and the output node 195; and its gate is coupled to the drain of the fifth switch and the drain of the third switch 140, e.g., at node 103.

The second switch 130, third switch 140, and fifth switch 160 form a first positive feedback loop 110 that facilitates a fast rising transition for gate sensing.

The fifth switch 170 has its source coupled to the gate of the first switch 120, the drain of the second switch 130, and the source of the fourth switch 160; its drain is coupled to the drain of the third switch 140 and to the gate of the fourth switch 160, e.g., at node 103. In addition, the gate of the fifth switch 170 is coupled to the drain of the fourth switch 160, which is coupled to the output node 195.

The fourth switch 160 and fifth switch 170 form a second positive feedback loop 111 that facilitates a fast falling transition for gate sensing.

The current source 150 has its negative terminal coupled to the source of the second switch 130 and the gate of the third switch 140, e.g., at node 102, and the positive terminal of the current source is coupled to ground. The first switch 120 is a high voltage FET since it is coupled directly to the high side power FET 24. The remaining switches 130, 140, 160 and 170 are low voltage FETs operating at the low voltage supply at node 101.

In one practical embodiment, the components of the gate sense circuit 100 are specified as follows. The first switch is a laterally-diffused, enhancement-type NMOS FET having a large channel width to length ratio, e.g., channel width=11.00 microns and channel length=1.2 microns, and operable at a high voltage, e.g., 30 VDC. The second switch 130 and third switch 140 are vertically-diffused, enhancement-type NMOS FETs having a channel width to length ratio of approximately one, e.g., channel width=1.5 microns and channel length=1.5 microns, and operable at a lower voltage, e.g., 7 VDC. The fourth switch 160 and fifth switch 170 are vertically-diffused, enhancement-type PMOS FETs having a channel width to length ratio of less than one, e.g., channel width=0.9 microns and channel length=3 microns, and also operable at a lower voltage, e.g., 7 VDC.

3. Operation of Gate Sense Circuit

The gate sense circuit 100 of FIG. 4 is used to generate a GATE_SENSE signal output at node 195 responsive to the detection of the rise and fall of voltage $V_G$ on the high-side gate of a power FET, such as power FET 24 in buck regulator circuit 10C measured at node 105. The GATE_SENSE signal is used in a logical scheme to control the operation of a buck regulator circuit, such as circuit 10C. The operation of the circuit 100 in conjunction with buck regulator circuit 10C will now be described.

When the voltage $V_G$ at the gate of power FET 24 is at ground, measured at node 105, the GATE_SENSE signal at node 195 is forced by switch 120 to also stay at ground. As the gate voltage $V_G$ of power FET 24 rises, the GATE_SENSE signal follows. During this stage, the propagation delay is determined by the resistance of switch 120 and the parasitic capacitance at node 195.

As $V_G$ rises above ground, the resistance of switch 120 gets higher due to less gate drive. Thus, the propagation delay tends to get a little bit longer. When the gate voltage $V_G$ of power FET 24 rises above ground to more than two times the gate/source voltage $V_{GS}$ of power FET 24, switches 130 and 140 turn on and the rising transition enters second stage. Thus, switch 140 overcomes the pull-up of switch 170 and pulls down the gate of switch 160. As switch 160 turns on, it helps to pull up the GATE_SENSE signal to follow the gate voltage $V_G$. Thus, switches 130, 140 and 160 form a positive feedback loop 110 to speed up the rising transition. In the second stage, the positive feedback loop 110 overcomes the potentially longer delay caused by higher resistance of switch 120.

As the gate voltage $V_G$ continues to rise to within one $V_{GS}$ of the supply voltage $V_{DD}$, switch 120 turns off. The GATE_SENSE signal is pulled up all the way to $V_{DD}$ by the positive feedback loop 110. Because the gate signal continues to rise quickly to very high voltage, switch 160 clamps the sense signal HS_GATE_SENSE to the voltage at node 101, which is usually $V_{DD}$, to avoid damage due to the capacitive coupling through switch 120.

When the gate signal falls, the sense signal HS_GATE_SENSE stays at $V_{DD}$ initially. As the gate falls below one $V_{GS}$ from $V_{DD}$, switch 120 turns on, and forces the gate sense signal HS_GATE_SENSE to follow. In this stage, node 195 is trying to follow node 105 going down. However, switch 160 is still trying to pull it up. Therefore, the delay is relatively longer. In the next stage, after the gate falls below two $V_{GS}$ from ground, switches 130 and 140 start to turn off. Switch 170 begins to turn off switch 160 by pulling up its gate. With switch 160 disabled, node 195 can fall much faster. Switches 160 and 170 form a second positive feedback loop 111 to speed up the second stage of falling transition.

For both rising and falling transitions, faster response occurs in the second stage which is nearly two times $V_{GS}$ from ground. This threshold can be changed by stacking more MOSFET devices in series with the source of either switch 130 or switch 140.

Figure 5C:
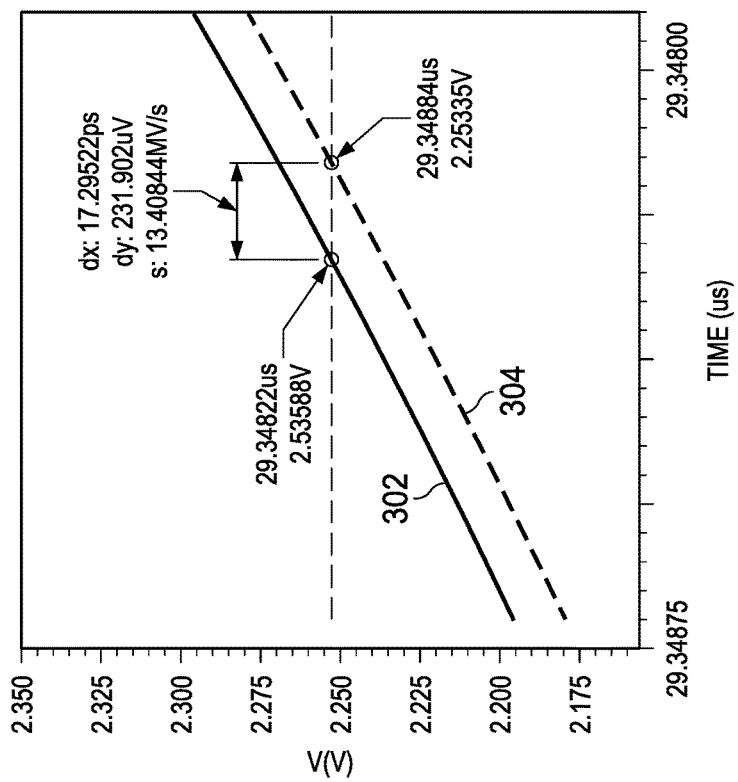
FIG. 5C is a graph illustrating the rising edges of the gate sense voltage and the gate voltage from detail 5C of FIG. 5A.

The signal response for circuit 100 is illustrated in graph 300 shown in FIG. 5A and represents the results of a circuit simulation. The gate voltage 302 is plotted against time, and transitions in cycles from 20 VDC to 0 VDC. The gate sense voltage 304 is also plotted against time, and transitions in cycles from 5 VDC to 0 VDC.

Figure 5B:
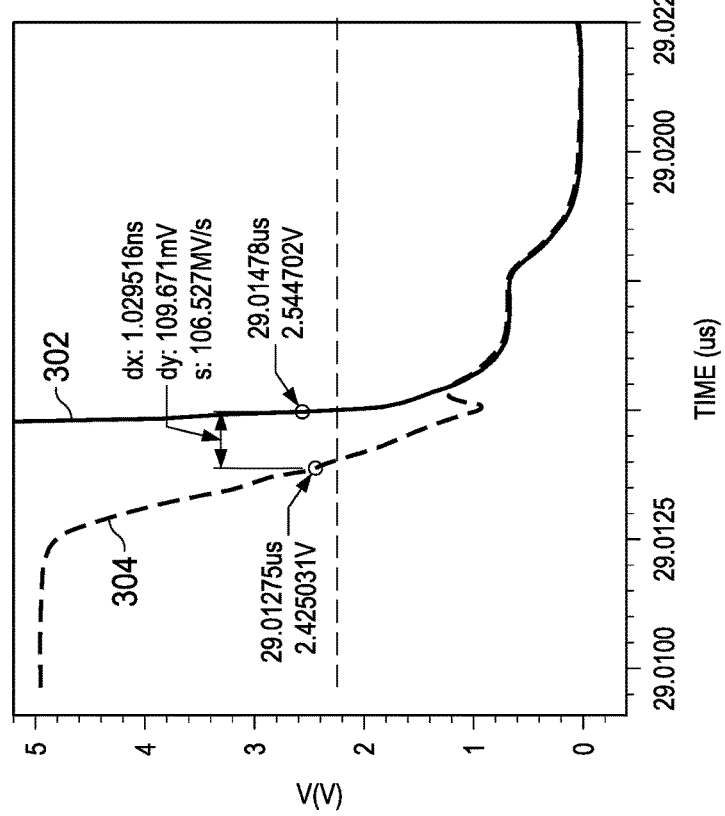
FIG. 5B is a graph illustrating the falling edges of the gate sense voltage and the gate voltage from detail 5B of FIG. 5A.

The falling edges of the gate voltage 302 and the gate sense voltage 304 are magnified in the partial view of FIG. 5B. This graph shows that the delay between the gate and the gate sense signal is on the order of 1 ns. The rising edges of the gate voltage 302 and the gate sense voltage 304 are magnified in the partial view of FIG. 5C. This graph shows that the delay between the gate and the gate sense signal is on the order of 17 ps. This is a significant improvement over the level shifting techniques, which result in delays on the order of 10 ns.

While one or more implementations have been described by way of example and in terms of the specific embodiments, it is to be understood that the one or more implementations are not limited to the disclosed embodiments. To the contrary, this disclosure is intended to cover various modifications and similar arrangements as would be apparent to those skilled in the art. Therefore, the scope of the appended claims should be accorded the broadest reasonable interpretation so as to encompass all such modifications and similar arrangements.

The invention claimed is:

1. A circuit for sensing voltage at a gate of a first power FET, comprising:
an input node coupled to the gate of the first power FET;
an output node; and
a switching circuit coupled between the input node and the output node, the switching circuit configured to generate a gate sense signal at the output node, the switching circuit including:
a first feedback loop to facilitate a rising gate voltage transition,
a second feedback loop to facilitate a falling gate voltage transition, and
a first switching FET having a high-voltage rating, and having a drain coupled to the input node; a source coupled to the output node; and a gate coupled to the first and second feedback loops, wherein the circuit detects the voltage of the first power FET and outputs a control signal at a voltage less than the detected gate voltage to control operation of a second power FET for preventing shoot—through where the first and second power FETs are on simultaneously.

2. A circuit for sensing voltage at a gate of a power FET, comprising:
an input node coupled to the gate of the power FET;
an output node; and
a switching circuit coupled between the input node and the output node, the switching circuit configured to generate a gate sense signal at the output node, the switching circuit including:
a first feedback loop to facilitate a rising gate voltage transition,
a second feedback loop to facilitate a falling gate voltage transition, and
a first switching FET having a high-voltage rating, and having a drain coupled to the input node; a source coupled to the output node; and a gate coupled to the first and second feedback loops, wherein
the first feedback loop includes a second switching FET, a third switching FET and a fourth switching FET; and
the second feedback loop includes the fourth switching FET and a fifth switching FET;
the second switching FET having a voltage rating lower than the high-voltage rating of the first switching FET, a drain coupled to the gate of the first switching FET at a first node, a source coupled to a second node, and a gate coupled to the source of the first switching FET;
the third switching FET having a voltage rating lower than the high-voltage rating of the first switching FET, a drain coupled to a third node, a source coupled to ground, and a gate coupled to a current source at the second node;
the fourth switching FET having a voltage rating lower than the high-voltage rating of the first switching FET, a drain coupled to the output node and to the gate of the fifth switching FET, a source coupled to the gate of the first switching FET and the drain of second switching FET at the first node, and a gate coupled to the drain of the third and fifth switching FETs at the third node; and
the fifth switching FET having a voltage rating lower than the high-voltage rating of the first switching FET, a drain coupled to the drain of the third switching FET at the third node and to the gate of the fourth switching FET, a source coupled to the gates of the first switching FET and the drain of the second switching FET at the first node, and a gate coupled to the drain of the fourth switching FET at the output node.

3. The circuit of claim 2, wherein the first switching FET is a high voltage NMOS structure.

4. The circuit of claim 2, wherein the first switching FET is a laterally diffused enhancement-type high voltage NMOS structure.

5. The circuit of claim 2, wherein the second and third switching FETs are low voltage MOS structures, and the fourth and fifth switching FETs are low voltage MOS structures.

6. The circuit of claim 2, wherein the second and third switching FETs are vertically-diffused, enhancement-type low voltage NMOS structures, and the fourth and fifth switching FETs are vertically-diffused, enhancement-type low voltage PMOS structures.

7. A method for sensing a gate signal on a power FET, comprising:
providing a switching circuit including a first switching FET having a high voltage rating, the switching FET having a drain coupled to the gate of the power FET, a source coupled at an output node, and a gate;
driving the gate of the first switching FET with the switching circuit;
sensing a rising gate voltage of the power FET using the switching circuit, and generating a sense signal corresponding to the rising gate voltage at the output node using the first switching FET; and sensing a falling gate voltage of the power FET using the switching circuit, and generating a sense signal corresponding to the falling gate voltage at the output node using the first switching FET;

providing feedback to the gate of the first switching FET via a first feedback loop for sensing the rising gate voltage of the power FET and via a second feedback loop for sensing the falling gate voltage of the power FET;

providing a second switching FET having a voltage rating lower than the high-voltage rating of the first switching FET, a drain coupled to the gate of the first switching FET at the first node, a source coupled to a second node, and a gate coupled to the source of the first switching FET;

providing a third switching FET having a voltage rating lower than the high-voltage rating of the first switching FET, a drain coupled to a third node, a source coupled to ground, and a gate coupled to a current source at the second node;

providing a fourth switching FET having a voltage rating lower than the high-voltage rating of the first switching FET, a drain coupled to the output node and to the gate of a fifth switching FET, a source coupled to the gate of the first switching FET and the drain of the second switching FET at the first node, and a gate coupled to the drain of the third and fifth switching FETs at the third node; and providing the fifth switching FET having a voltage rating lower than the high-voltage rating of the first switching FET, a drain coupled to the drain of the third switching FET at the third node and to the gate of the fourth switching FET, a source coupled to the gate of the first switching FET and the drain of the second switching FET at the first node, and a gate coupled to the drain of the fourth switching FET at the output node;

wherein the second, third and fifth switching FETs form the first feedback loop and the fourth and fifth switching FETs form the second feedback loop.

8. The method of claim 7, the step of sensing the rising gate voltage further comprising:

turning on the first feedback loop when the gate voltage of the power FET rises above ground to a predetermined voltage greater than a gate/source voltage between the gate and the source of the power FET.

9. The method of claim 8, further comprising:

setting the predetermined voltage at two times the gate/source voltage of the power FET above ground.

10. The method of claim 7, the step of sensing the falling gate voltage further comprising:

turning on the second feedback loop when the gate voltage of the power FET falls below a supply voltage to a predetermined voltage greater than a gate/source voltage between the gate and the source of the power FET.

* * * * *